United States Patent
Zinser

(10) Patent No.: US 7,460,043 B2
(45) Date of Patent: *Dec. 2, 2008

(54) ANALOG-TO-DIGITAL CONVERTER COMPENSATION SYSTEM AND METHOD

(75) Inventor: Richard Louis Zinser, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 606 days.

This patent is subject to a terminal disclaimer.

(21) Appl. No.: 11/145,443

(22) Filed: Jun. 3, 2005

(65) Prior Publication Data

US 2006/0274859 A1 Dec. 7, 2006

(51) Int. Cl.
*H03M 1/06* (2006.01)

(52) U.S. Cl. .................. 341/118; 341/120; 341/121; 341/155

(58) Field of Classification Search ................ 341/118, 341/120, 155
See application file for complete search history.

(56) References Cited

U.S. PATENT DOCUMENTS

| | | | |
|---|---|---|---|
| 4,896,155 A | 1/1990 | Craiglow | |
| 5,172,059 A | 12/1992 | den Boef | |
| 5,594,612 A | 1/1997 | Henrion | |
| 5,872,814 A | 2/1999 | McMeekin | |
| 6,028,424 A | 2/2000 | Twichell et al. | |
| 6,118,396 A | 9/2000 | Song | |
| 6,268,814 B1 | 7/2001 | Kolsrud | |
| 6,700,515 B2 * | 3/2004 | Asami | 341/120 |
| 6,911,925 B1 | 6/2005 | Slavin | |
| 7,119,724 B1 * | 10/2006 | Asami | 341/118 |
| 7,161,511 B2 * | 1/2007 | Koste et al. | 341/118 |
| 7,209,529 B2 * | 4/2007 | Iancu et al. | 375/346 |
| 2001/0033238 A1 | 10/2001 | Velazquez | |
| 2002/0175752 A1 | 11/2002 | Pomata et al. | |
| 2003/0006714 A1 | 1/2003 | Choi | |
| 2003/0128141 A1 * | 7/2003 | Asami | 341/120 |
| 2005/0207515 A1 | 9/2005 | Jensen et al. | |
| 2006/0267812 A1 * | 11/2006 | Bunin | 341/120 |
| 2006/0267813 A1 * | 11/2006 | Asami | 341/120 |
| 2006/0267814 A1 * | 11/2006 | Asami | 341/120 |
| 2006/0273942 A1 * | 12/2006 | Koste et al. | 341/118 |
| 2007/0247344 A1 * | 10/2007 | Gremillet | 341/155 |

FOREIGN PATENT DOCUMENTS

EP 0407919 4/1966

OTHER PUBLICATIONS

US Patent Application Entitled " Analog-to-Digital Converter Compensating Apparatus and Associated Methods" by Richard C. Gaus, Jr., U.S. Appl. No. 11/017,458, filed Dec. 20, 2004.
"Commonly-Owned US Patent Application Entitled" Linearization System and Method by GP Koste, et al, - filed concurrently.
AV Oppenheim, et al, "Digital Signal Processing" Digital Filter Design Techniques, Prentice Hall, Inc., ISBN 0-13-214635-5, 1975, pp. 242-244.

* cited by examiner

*Primary Examiner*—Linh V Nguyen
(74) *Attorney, Agent, or Firm*—Ann M. Agosti

(57) ABSTRACT

An analog-to-digital converter compensation method includes providing at least one analog tone, converting the analog tone into digital signals, and using the digital signals to generate an error compensation model comprising a plurality of compensation values corresponding to respective digital signals. The compensation values are obtained by applying a time domain window, performing a discrete Fourier transform on digital signals within the time domain window, zeroing out transform bins except for bins within lobes on selected spurious frequencies, performing an inverse Fourier transform, and obtaining resulting signals from applying an inverse of the time domain window.

17 Claims, 2 Drawing Sheets

ANALOG-TO-DIGITAL CONVERTER COMPENSATION SYSTEM AND METHOD

BACKGROUND

The invention relates to analog-to-digital converter compensation systems and methods.

Analog-to-digital (AID) converters generate three types of errors during operation: (i) random, wideband noise, (ii) spurious tone components that are not correlated to, nor harmonically related to, an input tone, and (iii) spurious tone components that are correlated to and harmonically related to an input tone (systematic error). Compensation algorithms are not presently available for wideband noise or spurious, non-correlated components.

However, tones due to systematic error are typically tones which result from recurring, repeatable errors in the output, and can thus be compensated. Repeatable systematic errors are highly correlated with two measurable values: the analog-to-digital index and the trajectory of the waveform at the time the analog-to-digital index was generated.

Conventional compensation techniques typically include training sequences such as: collecting error measurements from a large variety of training data, classifying each error sample collected according to its analog-to-digital index, and keeping a separate running total of error values and sample counts for analog-to-digital indices. After training and during operation (compensation), for each incoming analog-to-digital sample to be compensated, the address is found in the compensation table from the index, and the average error value at the address is subtracted this from the input value to get the compensated output.

Frequency domain algorithms to generate the training data are described in U.S. application Ser. No. 11/017,458, filed 20 Dec. 2004 and entitled "Analog-to-Digital Converter Compensating Apparatus and Associated Methods." Briefly, the general idea is to take a discrete Fourier transform (DFT), such as a fast Fourier transform (FFT) for example, of the input signal, then zero out the bins corresponding to random noise or other uncorrectable spurious components, and then finally inverse transform the modified spectrum back into the time domain. In this embodiment, to avoid energy leakage between the bins, the training frequencies are selected to fall on DFT bin frequencies (by locking together the analog-to-digital sampling clock and training signal generator).

It would be desirable to have an analog-to-digital converter compensation system and method which do not have the design constraints of conventional techniques.

BRIEF DESCRIPTION

Briefly, in accordance with one embodiment of the present invention, an analog-to-digital converter compensation system comprises: a training signal generator configured for providing at least one analog tone; an analog-to-digital converter configured for converting the tone into digital signals; and a processor configured for using the digital signals to generate an error compensation model comprising a plurality of compensation values corresponding to respective digital signals by applying a time domain window, performing a discrete Fourier transform on digital signals within the time domain window, zeroing out transform bins except for bins within lobes on selected spurious frequencies, performing an inverse Fourier transform, and obtaining resulting signals from applying an inverse of the time domain window.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
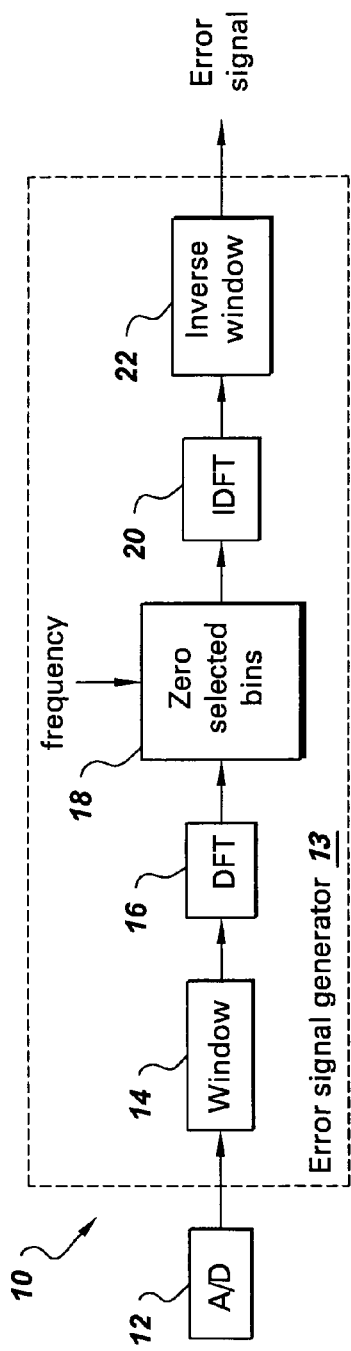
FIG. 1 is a block diagram of an analog-to-digital converter compensation system in accordance with one embodiment of the present invention.

In one embodiment, illustrated primarily by FIG. 1, analog-to-digital converter compensation system 10 comprises: a training signal generator configured for providing at least one analog tone (shown as element 46 of FIG. 3); an analog-to-digital converter 12 configured for converting the tone into digital signals; and a processor (shown as error signal generator 13 in FIG. 1) configured for using the digital signals to generate an error compensation model comprising a plurality of compensation values corresponding to respective digital signals by applying a time domain window 14, performing a discrete Fourier transform 16 on digital signals within the time domain window, zeroing out transform bins 18 except for bins within lobes on selected spurious frequencies, performing an inverse Fourier transform 20, and obtaining resulting signals from applying an inverse of the time domain window 22. In one embodiment, the discrete Fourier transform comprises a fast Fourier transform (FFT).

The compensation system thus computes the compensation factors in the frequency domain and then transforms the result back into the time domain so that the compensation factors can be simply added to the analog-to-digital output. Applying a time domain energy-concentrating window to the signal provides flexibility in choosing training frequencies and does not require that an analog-to-digital sampling clock and the training signal generator be locked to the same source. The fact that training frequencies are no longer constrained to fall exactly on a transform bin provides the beneficial effect of reducing the time required for training because sinusoidal training signals can be chosen such that their amplitude values do not repeat during the training time and provide a greater coverage in the compensation table than was previously attainable with on-bin frequencies.

The lobe locations of the selected spurious frequencies are typically at the harmonic frequencies. When the harmonic frequencies are unknown, an alternative is to zero out all transform bins near calibration frequencies, DC, and any bins below a predetermined threshold. The threshold is set according to that which would typically remove the noise floor and this embodiment is thus sometimes referred to as the "lawnmower" embodiment.

The role of the time domain window 14 is to pack the spectral energy densely into one area of interest. Selected distortion product frequencies can be estimated, with the frequencies of particular interest generally corresponding to the odd-order products. The inverse window 22 is typically an inverted version of time domain window 40 except that, as described below, in some embodiments, time domain signals are removed at the edges of the inverse window to reduce potential noise effects.

Several examples of useful time domain windows include Hamming, Hanning, Blackman, and Blackman-Harris windows. The time domain window is selected to substantially attenuate inter-bin leakage products when the sinusoids do not fall on bin frequencies. Almost all of the signal energy is contained within a few bins of the center frequency. For example, typically over ninety-nine percent of the energy falls within plus or minus two bins for most windows. Furthermore, advanced windows (such as four-term Blackman-Harris windows, for example) can provide spectral side lobe attenuation levels at the 120 dB design point for the system at plus or minus seventeen bins from any sinusoidal signal. In comparison, a rectangular window (that is, no window) provides less than about 40 dB of side lobe attenuation at this distance.

Most conventional time domain windows taper to near zero at the edges. The result is that the values of the inverse window then appear very large in this region and the combination of window/inverse window significantly decreases the signal-to-arithmetic-noise ratio there. In one embodiment, edge effects are compensated by removing a percentage of the window. In one example, one-half of the time-domain output samples are removed and only the samples from one quarter of the window size though three quarters of the window size are used. Because some of the training data is discarded, it may appear that more training data is required when using such windows. However, this factor is counterbalanced by the ability to choose frequencies whose sample values do not repeat within the window. This allows use of a fewer number of training frequencies because each individual frequency gives a larger "coverage" in the table than would otherwise be possible.

To briefly summarize several of the advantages of this embodiment, it is not necessary to lock the training signal generator and the sampling clock to the same frequency standard, the exact frequency of the training signal need not be known, and shorter training times result because "more interesting" frequencies with non-repeating sample values can be used.

Figure 2:
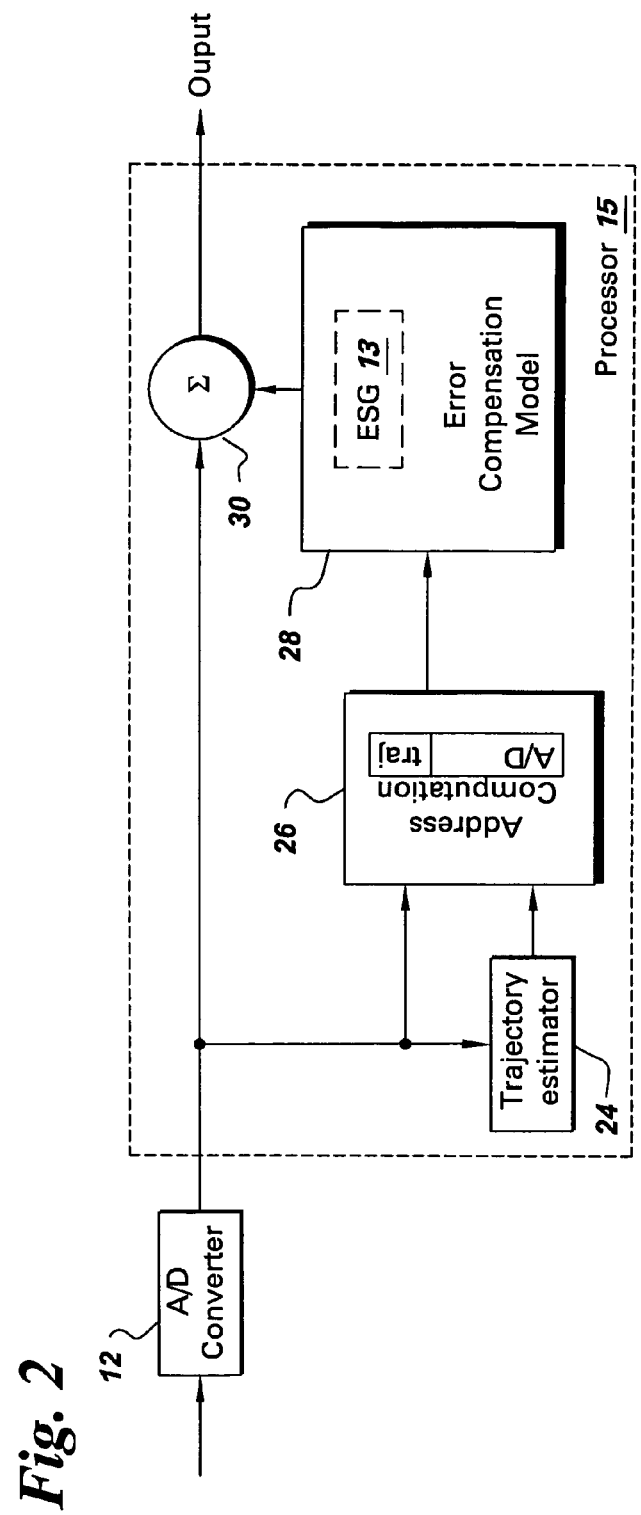
FIG. 2 is a block diagram of another analog-to-digital converter compensation system in accordance with an additional embodiment of the present invention.

In a more specific embodiment of the present invention, as shown in FIG. 2, processor 15, in addition to including error signal generator 13, is further configured for generating an error compensation look up table and the plurality of compensation values additionally correspond to trajectory estimations of respective digital signals. In other words, the error compensation model 28 comprises a model including a plurality of compensation values corresponding to respective digital signals and trajectory estimations. The digital signal portion (A/D) of address computation module 26 is obtained from analog-to-digital converter 12, and the trajectory portion (traj) is obtained from a trajectory estimator 24.

In one example of a twenty bit address wherein the data is stored in a look-up table of the error compensation model, the digital signal portion occupies fourteen bits, the trajectory estimation portion occupies six bits, and there is one address for each combination of the two portions [A/D bits][traj bits] to position the associated error value as calculated from the digital signal. If more than one instance of a particular [A/D bits][traj bits] combination occurs during training, in one embodiment the average error value for the multiple instances is stored in the corresponding address. Typically, in this embodiment, the multiple error values for each address are stored and averaged at the end of the training sequence. Another optional feature when forming a look-up table is to use an interpolation algorithm to fill in zero-valued table entries with error estimates based on nearby non-zero entries.

For trajectory estimation, any of a number of techniques may be used and the size of any associated table or data storage of the error compensation model is typically a factor in selecting among the techniques. For example, in one embodiment, the processor is configured for performing trajectory estimation by obtaining the slope of the signal. The slope itself can be obtained by any appropriate technique with several options including: current value minus last value divided by intervening time; if intervening time is constant, then current value minus last value; and filtering.

Another example trajectory estimation technique is to use the previous sample value of the digital signal. A more specific aspect of this example is to use a specific number of most significant bits of the previous sample. In the example above of a six bit trajectory portion, the number of bits would be six. The most significant bit example works particularly well at low frequencies. In one embodiment, low frequencies are defined as frequencies in the bottom third of the frequency spectrum of interest.

Still another trajectory example is one wherein the processor is configured for performing trajectory estimation by truncating and concatenating one or more of the previous sample values of the signal. For example, in one embodiment, the most significant bits from the last four samples are selected. This example is expected to work particularly well at high frequencies. In one embodiment, high frequencies are defined as frequencies above the bottom-third of the frequency spectrum of interest. These techniques are also described in commonly assigned and concurrently filed Docket Number 162332 invented by Glen Koste et al. and entitled "Linearization System and Method," which is herein incorporated by reference.

Figure 3:
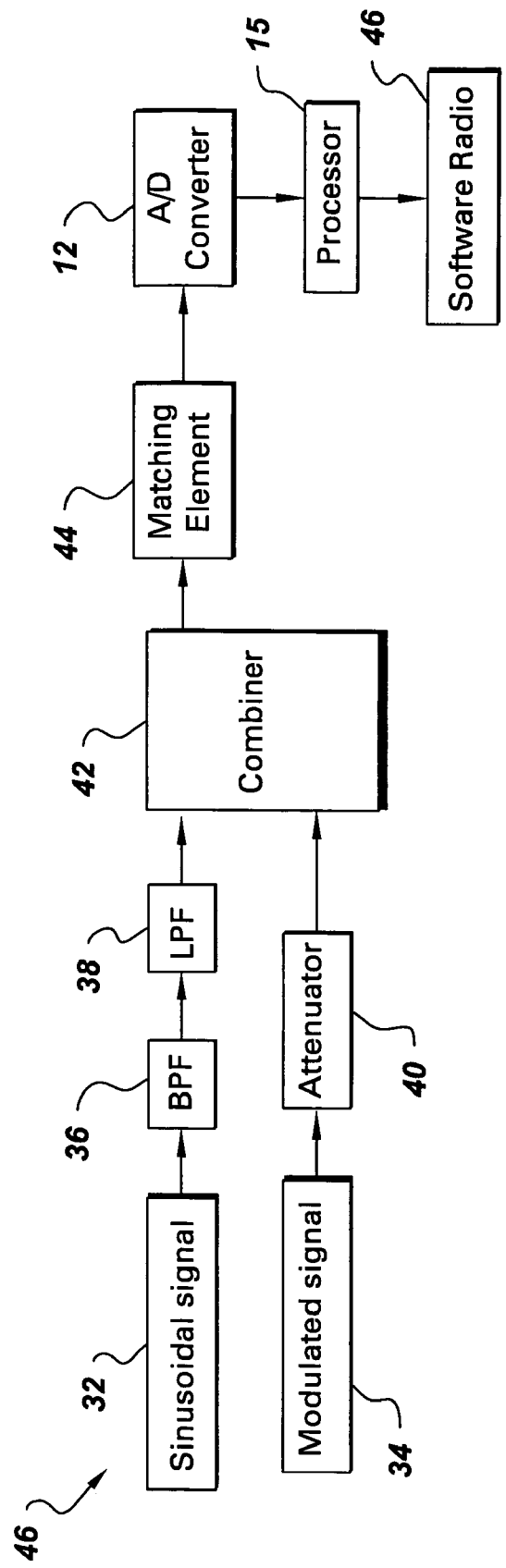
FIG. 3 is a block diagram of apparatus used to evaluate the performance of one embodiment of the present invention.

FIG. 3 is a block diagram of a laboratory set up that is designed to evaluate the performance of the compensation method. It includes training signal generator 46 that was used for the training phase. Up to about twenty-five dB of spurious second harmonic rejection was observed.

Sinusoid signal generator 32 operated as the interference signal and was set at 9.787 MHz and −10 dBm. Modulated sinusoid signal generator 34 operated as the desired signal and was set at 19.754 MHz and −58 dBm using FM voice modulation with a 3 kHz deviation. Band pass filter 36 comprised a filter centered on 10.7 MHz with a 2 MHz bandwidth. Low pass filter 38 comprised an air core filter with a cutoff frequency of 10 MHz. Attenuator 40 comprised a 3 dB attenuator. After training, and during operation, summation element 42 was used to combine the results of the two signal paths with the resulting combined signal being matched by matching element 44. The function of matching element 44 was to match the impedance of the summation element 42 to the impedance of the analog-to-digital converter 12. A processor 15 of the type shown in FIG. 2 was used to process the signal from the analog-to-digital converter, and a software radio 46 was used to determine whether error compensation was accomplished.

During the experiment, the tuner frequency of software radio 46 was controlled to be 19.574 MHz with the mode being FM. For training, sinusoid signal generator 32 was turned on and modulated sinusoid signal generator 34 was turned off. Training was accomplished via the look up table and error signal generation techniques discussed with respect to FIGS. 1 and 2. More specifically, the previous sample value technique was used for the trajectory estimations and the transform bins were zeroed out using lobe locations at harmonic frequencies.

During operation, modulated sinusoid signal generator 34 was used as the desired signal and sinusoidal signal generator 32 was used as the interferer. With the compensation module bypassed, the received interference level was 62.5 dB. When the compensation module was activated, the received interference level was reduced to 37 dB. The improvement in signal-to-interference ratio was thus calculated to be 25.5 dB. Informal listening tests verified the efficacy of the method. Without the compensation module, the detected FM audio was unintelligible, but when the compensation module was operating, the received audio was judged to be of good quality.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An analog-to-digital converter compensation system comprising:
   a training signal generator configured for providing at least one analog tone;
   an analog-to-digital converter configured for converting the analog tone into digital signals; and
   a processor configured for using the digital signals to generate an error compensation model comprising a plurality of compensation values corresponding to respective digital signals by applying a time domain window, performing a discrete Fourier transform on digital signals within the time domain window, zeroing out transform bins except for bins within lobes on selected spurious frequencies, performing an inverse Fourier transform, and obtaining resulting signals from applying an inverse of the time domain window.

2. The system of claim 1 wherein the error compensation model comprises an error compensation look up table and wherein the plurality of compensation values additionally correspond to trajectory estimations of the respective digital signals.

3. The system of claim 2 wherein the processor is configured for performing trajectory estimation by obtaining the slope of the signal.

4. The system of claim 2 wherein the processor is configured for performing trajectory estimation by using the previous sample value of the signal.

5. The system of claim 2 wherein the processor is configured for performing trajectory estimation by truncating and concatenating one or more of the previous sample values of the signal.

6. The system of claim 2 wherein the processor is further configured for removing edge portions of the inverse of the time domain window.

7. The system of claim 6 wherein the processor is further configured for performing the zeroing out by using lobe locations at harmonic frequencies.

8. The system of claim 6 wherein the processor is further configured for performing the zeroing out by zeroing out Fourier transform bins near calibration frequencies, DC, and below a predetermined noise floor threshold.

9. An analog-to-digital converter compensation system comprising:
   a training signal generator configured for providing at least one analog tone;
   an analog-to-digital converter configured for converting the analog tone into digital signals; and
   a processor configured for using the digital signals to generate an error look up table comprising a plurality of compensation values corresponding to respective digital signals and trajectory estimations by applying a time domain window, performing a discrete Fourier transform on digital signals within the time domain window, zeroing out transform bins except for bins within lobes on selected spurious frequencies, performing an inverse Fourier transform, and obtaining resulting signals from applying an inverse of the time domain window and removing edge portions of the inverse of the time domain window.

10. An analog-to-digital converter compensation method comprising:
    (a) providing a training signal comprising an analog tone;
    (b) converting the analog tone into digital signals; and
    (c) using the digital signals to generate an error compensation model comprising a plurality of compensation values corresponding to respective digital signals by
       (i) applying a time domain window,
       (ii) performing a discrete Fourier transform on digital signals within the time domain window,
       (iii) zeroing out transform bins except for bins within lobes on selected spurious frequencies,
       (iv) performing an inverse Fourier transform, and
       (v) obtaining resulting signals from applying an inverse of the time domain window.

11. The method of claim 10 wherein the error compensation model comprises a look up table and wherein the plurality of compensation values additionally correspond to trajectory estimations of the respective digital signals.

12. The method of claim 11 further comprising obtaining the trajectory estimations by obtaining the slope of the signal.

13. The method of claim 11 further comprising obtaining the trajectory estimations by using the previous sample value of the signal.

14. The method of claim 11 further comprising obtaining the trajectory estimations by truncating and concatenating one or more of the previous sample values of the signal.

15. The method of claim 11 further comprising removing edge portions of the inverse of the time domain window.

16. The method of claim 15 wherein zeroing out comprises using lobe locations at harmonic frequencies.

17. The method of claim 15 wherein zeroing out comprises zeroing out Fourier transform bins near calibration frequencies, DC, and below a predetermined noise floor threshold.

* * * * *